United States Patent
Sacco et al.

(10) Patent No.: US 6,504,758 B2
(45) Date of Patent: Jan. 7, 2003

(54) CONTROL CIRCUIT FOR A VARIABLE-VOLTAGE REGULATOR OF A NONVOLATILE MEMORY WITH HIERARCHICAL ROW DECODING

(75) Inventors: Andrea Sacco, Alessandria (IT); Osama Khouri, Milan (IT); Rino Micheloni, Turate (IT); Guido Torelli, Sant'Alessio Con Vialone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/960,851

(22) Filed: Sep. 21, 2001

(65) Prior Publication Data

US 2002/0097627 A1 Jul. 25, 2002

(30) Foreign Application Priority Data

Sep. 22, 2000 (IT) ......................................... TO00A0892

(51) Int. Cl.[7] ................................................ G11C 16/04
(52) U.S. Cl. ............................ 365/185.18; 365/185.13; 365/185.23
(58) Field of Search ........................ 365/185.13, 185.18, 365/185.23, 185.28, 185.29

(56) References Cited

U.S. PATENT DOCUMENTS 5,991,198 A * 11/1999 Song et al. ............. 365/185.13
6,072,722 A * 6/2000 Hirano ................... 365/185.13
6,307,778 B1 * 10/2001 Micheloni et al. ...... 365/185.09

* cited by examiner

Primary Examiner—Son Mai
(74) Attorney, Agent, or Firm—Lisa K. Jorgenson; Harold H. Bennett, II; Seed IP Law Group PLLC

(57) ABSTRACT

Described herein is a nonvolatile memory comprising a memory array organized according to global word lines and local word lines; a global row decoder; a local row decoder; a first supply stage for supplying the global row decoder; and a second supply stage for supplying the local row decoder; and a third supply stage for biasing the drain and source terminals of the memory cells of the memory array. Each of the supply stages comprises a respective resistive divider formed by a plurality of series-connected resistors, and a plurality of pass-gate CMOS switches each connected in parallel to a respective resistor. The nonvolatile memory further comprises a control circuit for controlling the pass-gate CMOS switches of the supply stages, and a switching circuit for selectively connecting the supply input of the control circuit to the output of the second supply stage during reading and programming of the memory, and to the output of the third supply stage during erasing of the memory.

20 Claims, 3 Drawing Sheets

CONTROL CIRCUIT FOR A VARIABLE-VOLTAGE REGULATOR OF A NONVOLATILE MEMORY WITH HIERARCHICAL ROW DECODING

BACKGROUND OF THE INVENTION

1. Field of the Invention

The present invention relates to a nonvolatile memory with hierarchical row decoding, and more in particular to a control circuit of a variable-voltage regulator forming part of said nonvolatile memory.

2. Description of the Related Art

As is known, nonvolatile memory devices are typically organized as an array, in which word lines connect gate terminals of the memory cells arranged on the same row, and bit lines connect drain terminals of the memory cells arranged on the same column.

The rows of the memory array are addressed by means of a row decoder, which receives at an input a coded address, and has the purpose of biasing the word line of the row each time addressed at a stable and precise voltage, the value of which depends upon the type of operation carried out on the memory cells of that particular row (reading, programming, verifying, erasing).

Furthermore, in certain nonvolatile memories the memory array is organized in global word lines and local word lines. In particular, the memory array comprises global word lines and a plurality of local word lines for each global word line, the local word lines being connected to the corresponding global word line via respective switching stages having the purpose of enabling, when they are on, transfer of the voltage present on the global word line to the respective local word line, and to which the memory cells are then physically connected.

A global row decoder addresses the global word lines, and a local row decoder addresses the local word lines. In particular, the global row decoder is directly connected to the global word lines and each time biases the line or lines selected, whilst the local row decoder controls the switching stages in such a way as to enable selective connection between the local word lines and the respective global word line.

For proper operation, each of the switching stages needs to receive a biasing voltage that is stable, precise and variable according to discrete values within a certain range, in which the lower end of the range is less than the supply voltage.

In particular, the switching stages typically have a CMOS-type structure and are formed by a PMOS transistor and an NMOS transistor having their respective source and drain terminals connected together and to the global word line, their respective drain and source terminals connected together and to the local word line, and gate terminals receiving respective control signals that are complementary to one another.

The NMOS transistor moreover has a bulk terminal which must be biased at a voltage that is equal to ground voltage during the steps of reading and programming of the memory cells, and is equal to a negative erasure voltage, for example −8 V, during the erasure step, whilst the PMOS transistor has a bulk terminal which must be biased at a voltage that typically assumes a value of approximately 6 V during the reading step, a voltage of approximately 1.5 V during the erasure step, and presents a staircase waveform with pre-set steps during the programming step, in which the initial and final values of the staircase depend upon the type of memory cells used; for example, for four-level memory cells (i.e., memory cells able to store 2 bits per cell) the programming voltage varies between 1.5 and 9 V with steps of approximately 300 mV.

It is, however, known that nonvolatile memories are typically of the single-supply-voltage type; i.e., they receive from outside a single supply voltage having a value of, for instance, between 2.5 and 3.8 V.

Consequently, the aforesaid voltage variable between 1.5 and 9 V, as in general all voltages that present staircase waveforms, is generated inside the nonvolatile memory in the way illustrated in FIG. 1, namely, by means of a supply stage formed by a voltage-boosting circuit 2 and a voltage regulator 3 cascade-connected.

In particular, the voltage-boosting circuit 2, generally known as "voltage booster" or "charge pump", is fed with the supply voltage $V_{CC}$ supplied from outside to the nonvolatile memory and supplies at output a boosted voltage $V_{HV}$ higher than the supply voltage $V_{CC}$. Since the boosted voltage $V_{HV}$ is not very voltage-stable, it is then supplied at input to the voltage regulator 3, which supplies at output a regulated voltage $V_{REG}$, which is voltage-stable and presents the staircase waveform with the values referred to above.

In particular, the voltage regulator 3 typically has a circuit structure of the variable-gain feedback operational amplifier type shown in FIG. 2; i.e., it basically comprises an operational amplifier 4 and a resistive-type feedback network 8.

In detail, the operational amplifier 4 has a supply terminal receiving the boosted voltage $V_{HV}$ generated by the voltage-boosting circuit 2, a non-inverting terminal receiving a reference voltage $V_{REF}$, an inverting terminal connected to a node 6, and an output terminal supplying the regulated voltage $V_{REG}$, whilst the feedback network 8 consists of a resistive divider formed by a first feedback resistor 10 of a variable type connected between the output terminal of the operational amplifier 4 and the node 6 and having a resistance $R_A$, and a second feedback resistor 12 connected between the node 6 and the inverting terminal of the operational amplifier 4 and having a resistance $R_B$.

With the circuit structure shown in FIG. 2, the regulated voltage $V_{REG}$ is therefore linked to the reference voltage $V_{REF}$ by the known relation:

$$V_{REG} = V_{REF} \cdot \left(1 + \frac{R_A}{R_B}\right)$$

Given that the second feedback resistor 12 has a constant resistance $R_B$, by varying the resistance $R_A$ of the first feedback resistor 10, the regulated voltage $V_{REG}$ is accordingly made to vary as a function of the ratio between the feedback resistances $R_A$ and $R_B$.

The first feedback resistor 10 is generally made in the way shown in Figure namely, it is formed by N resistors, designated by 14.1, 14.2, ..., 14.N, connected in series and identical to one another, and a plurality of switches, designated by 16.1, 16.2, ..., 16.N, each of which is connected in parallel to a respective resistor 14.1–14.N, and by means of which it is possible to short-circuit each of the resistors 14.1–14.N independently of one another.

The switches 16.1–16.N are typically pass-gate CMOS switches, and each of them receives, on a first control terminal and a second control terminal, respectively a first control signal and a second control signal, which are complementary to one another and are designated, in FIG. 3, by $\phi_1$, $\overline{\phi}_1$ for the first switch 16.1, $\phi_2$, $\overline{\phi}_2$ for the second switch 16.2, and so forth.

In particular, through the appropriate opening or closing command of the switches 16.1–16.N it is possible to obtain a resistance that varies between a minimum value of zero, when all the switches 16.1–16.N receive a closing command and short-circuit the respective resistors 14.1–14.N, and a maximum value equal to the sum of the resistances of all the resistors 14.1–14.N, when all the switches 16.1–16.N receive an opening command and do not short-circuit the respective resistors.

The smaller the resistance of the switches 16.1–16.N that are closed, the greater the precision obtained on the regulated voltage $V_{REG}$.

In fact, if it is assumed that of the N resistors 14.1–14.N that form the first feedback resistor 10, K are not short-circuited, i.e., that is K switches are open and N-K switches are closed, then the ideal regulated voltage $V_{REG}$, i.e., the voltage that would be obtained if all the switches were ideal and hence did not have a resistance of their own, would be:

$$V_{REG} = V_{REF} \cdot \left(1 + \frac{K \cdot R_S}{R_B}\right)$$

where $R_S$ is the resistance of each of the resistors 14.1–14.N, whereas the actual regulated voltage $V_{REG}$, i.e., the voltage that is obtained if the resistance of the switches is taken into account is:

$$V_{REG} = V_{REF} \cdot \left(1 + \frac{K \cdot R_S + (N - K) \cdot R_1}{R_B}\right)$$

where $R_I$ is the resistance of each of the switches 14.1-14.N when they are closed.

Consequently, the absolute error E made on the value of the regulated voltage $V_{REG}$ is:

$$E = V_{REF} \cdot \frac{(N - K) \cdot R_1}{R_B}$$

As may be noted, the absolute error E made on the value of the regulated voltage $V_{REG}$ is directly proportional to the resistance of the switches 16.1–16.N and to their number, so that it is evident how the minimization of said absolute error E can be obtained by minimizing the resistance of said switches, i.e., by rendering the NMOS and PMOS transistors forming said switches sufficiently conductive.

FIG. 4 shows the circuit diagram of one of the switches 16.1–16.N, namely the switch 16.1, which is formed by a PMOS transistor 18.1 and an NMOS transistor 20.1 having their respective source and drain terminals connected together and defining a first node A, which is in turn connected to a first terminal of the corresponding resistor 14.1, their respective drain and source terminals connected together and defining a second node B, which is in turn connected to a second terminal of the corresponding resistor 14.1, and gate terminals respectively receiving the control signals $\phi_1$ and $\overline{\phi}_1$.

The control signals $\phi_1$, and $\overline{\phi}_1$ are generated by a control circuit, designated by 22 in FIG. 4, having a supply input receiving a supply voltage $V_{PG}$, a signal input receiving control signals S generated by an appropriate control circuit (not shown), and a plurality of pairs of outputs, one for each of the switches 16.1–16.N, which supply the control signals $\phi_1$, $\overline{\phi}_1$, . . . , $\phi_N$, $\overline{\phi}_N$ for the switches 16.1–16.N.

In order to minimize the resistance of the switch 16.1 when the latter is closed, namely the resistance "seen" between the nodes A and B, the amplitudes of the control signals $\phi_1$ and $\overline{\phi}_1$ supplied to the gate terminals of the PMOS transistor 18.1 and NMOS transistor 20.1 must be sufficiently high. In fact, if the nodes A and B are at a relatively low potential, the PMOS transistor 18.1 will conduct little current, whereas it will be the NMOS transistor 20.1 that will conduct most of the current, thus causing a short circuit which will be all the more effective the greater the amplitude of the control signal $\overline{\phi}_1$ supplied to the gate terminal of the NMOS transistor 20.1.

If, instead, the nodes A and B are at a relatively high potential, the NMOS transistor 20.1 will make only a small contribution to conducting current, which will prevalently flow in the PMOS transistor 18.1, and it will be therefore the latter that will bring about an effective short circuit. In this condition of biasing of the nodes A and B, moreover, turning-off of the PMOS transistor 18.1 may be obtained effectively simply by supplying, to its gate terminal, a control signal $\phi_1$ having a high amplitude, namely, a control signal at least equal to the voltage of the node A.

In order to bias the gate terminals of the PMOS and NMOS transistors of the switches 16.1–16.N in such a way as to guarantee good conductivity of the latter, its has been proposed in the past to supply, to the control circuit 22, as supply voltage $V_{PG}$, the boosted voltage $V_{HV}$ generated by the voltage-boosting circuit 2. In this way, in fact, since the boosted voltage $V_{HV}$ is higher than the regulated voltage $V_{REG}$ generated by the voltage regulator 3, the control signals supplied to the switches 16.1–16.N have amplitudes that are as high as possible.

Since, however, the boosted voltage $V_{HV}$ is characterized by a very marked pulse waveform, by means of the capacitive coupling constituted by the gate-source and gate-drain capacitances of the PMOS transistors 18 and NMOS transistors 20 of the switches 16.1–16.N, the said pulse waveform is brought onto the output of the voltage regulator 3 and constitutes an undesirable disturbance present on the regulated voltage $V_{REG}$ generated by the voltage regulator 3.

Consequently, the above solution is satisfactory as regards the conductivity of the PMOS transistors 18 and NMOS transistors 20, but is unsatisfactory as regards noise rejection.

To overcome the aforesaid problem, an alternative solution has been proposed, which consists in supplying to the control circuit 22, as its supply voltage $V_{PG}$, the regulated voltage $V_{REG}$ supplied by the voltage regulator 3. This solution is satisfactory both from the standpoint of the conductivity of the PMOS transistors 18 and NMOS transistors 20 and from the standpoint of noise rejection as long as the regulated voltage $V_{REG}$ supplied by the voltage regulator 3 is sufficiently high, whereas it loses efficacy at the moment when the voltage regulator 3 is required to supply a relatively low regulated voltage $V_{REG}$, i.e., even lower than the supply voltage $V_{CC}$ supplied from outside to the nonvolatile memory.

In this condition, in fact, the PMOS transistors 18 and NMOS transistors 20 of the switches 16.1–16.N, which are intended to behave as short circuits, would in effect be equivalent to resistors the resistances of which are a function of the regulated voltage $V_{REG}$ supplied by the voltage regulator 3, and would thus directly contribute to determining the resistance of the first feedback resistor 10, and hence the value of the regulated voltage $V_{REG}$ itself, with an evident loss of precision, or in the extreme case, of the control of the desired value of the regulated voltage $V_{REG}$.

SUMMARY OF THE INVENTION

An Embodiment of the present invention obtains a nonvolatile memory provided with a voltage regulator controlled by a control circuit which enables the drawbacks of the control circuits described above to be, at least partially, overcome.

According to an embodiment of the present invention, a nonvolatile memory is provided, comprising a memory array organized according to global word lines and local word lines. The memory includes a global row decoder, a local row decoder, a first supply stage for supplying the global row decoder; a second supply stage for supplying the local row decoder, and a third supply stage for biasing the drain and source terminals of the memory cells of the memory array.

Each of the supply stages comprises a respective resistive divider formed by a plurality of series-connected resistors, and a plurality of pass-gate CMOS switches each connected in parallel to a respective resistor. The nonvolatile memory further comprises a control circuit for controlling the pass-gate CMOS switches of the supply stages, and a switching circuit for selectively connecting the supply input of the control circuit to the output of the second supply stage during reading and programming of the memory, and to the output of the third supply stage during erasing of the memory.

A method of operation is also provided, according to an embodiment of the invention.

BRIEF DESCRIPTION OF THE SEVERAL VIEWS OF THE DRAWING(S)

For a better understanding of the present invention, a preferred embodiment thereof is now described, purely by way of non-limiting example, with reference to the attached drawings, in which.

DETAILED DESCRIPTION OF THE INVENTION

Figure 1:
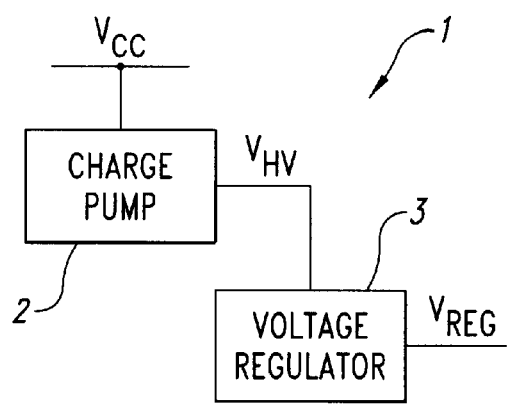
FIG. 1 shows a circuit diagram of a supply stage generating a regulated voltage used in a nonvolatile memory with hierarchical row decoding, according to known art.
Figure 2:
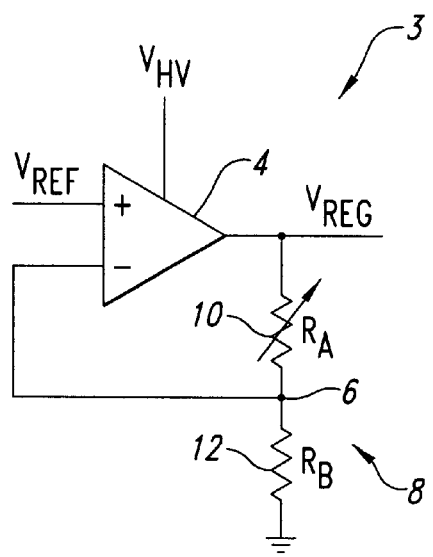
FIG. 2 shows a schematic circuit diagram of a variable-voltage regulator forming part of the supply stage of FIG. 1, according to known art.
Figure 3:
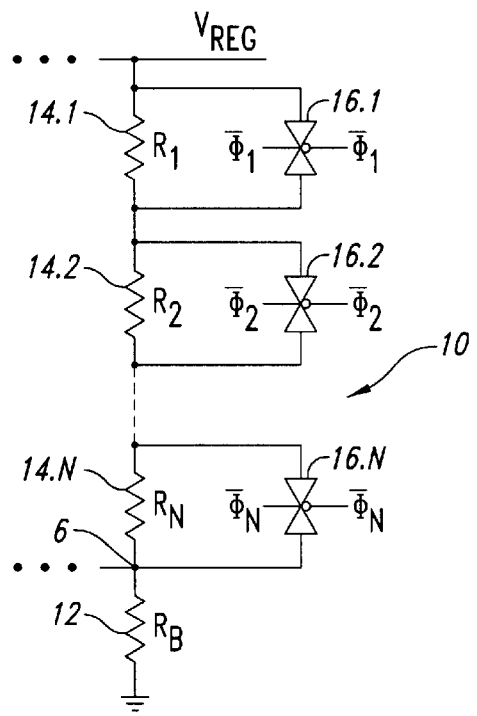
FIG. 3 shows, in greater detail, a circuit diagram of one part of the variable-voltage regulator of FIG. 2, according to known art.
Figure 4:
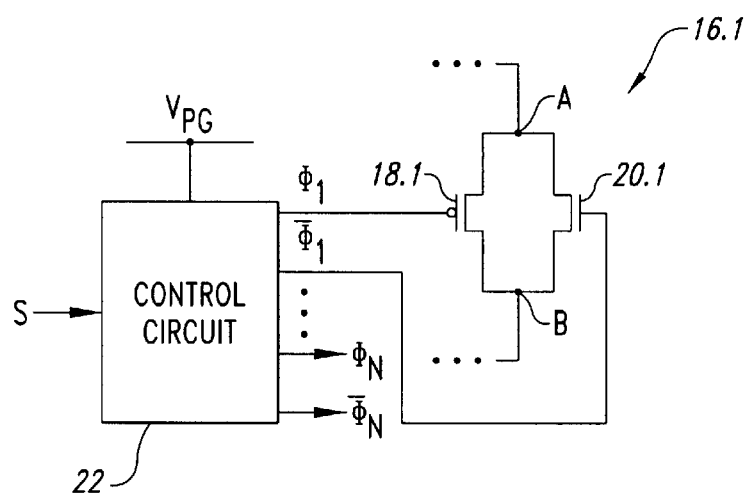
FIG. 4 shows a circuit diagram of a pass-gate CMOS switch and of a corresponding control circuit, according to known art.
Figure 5:
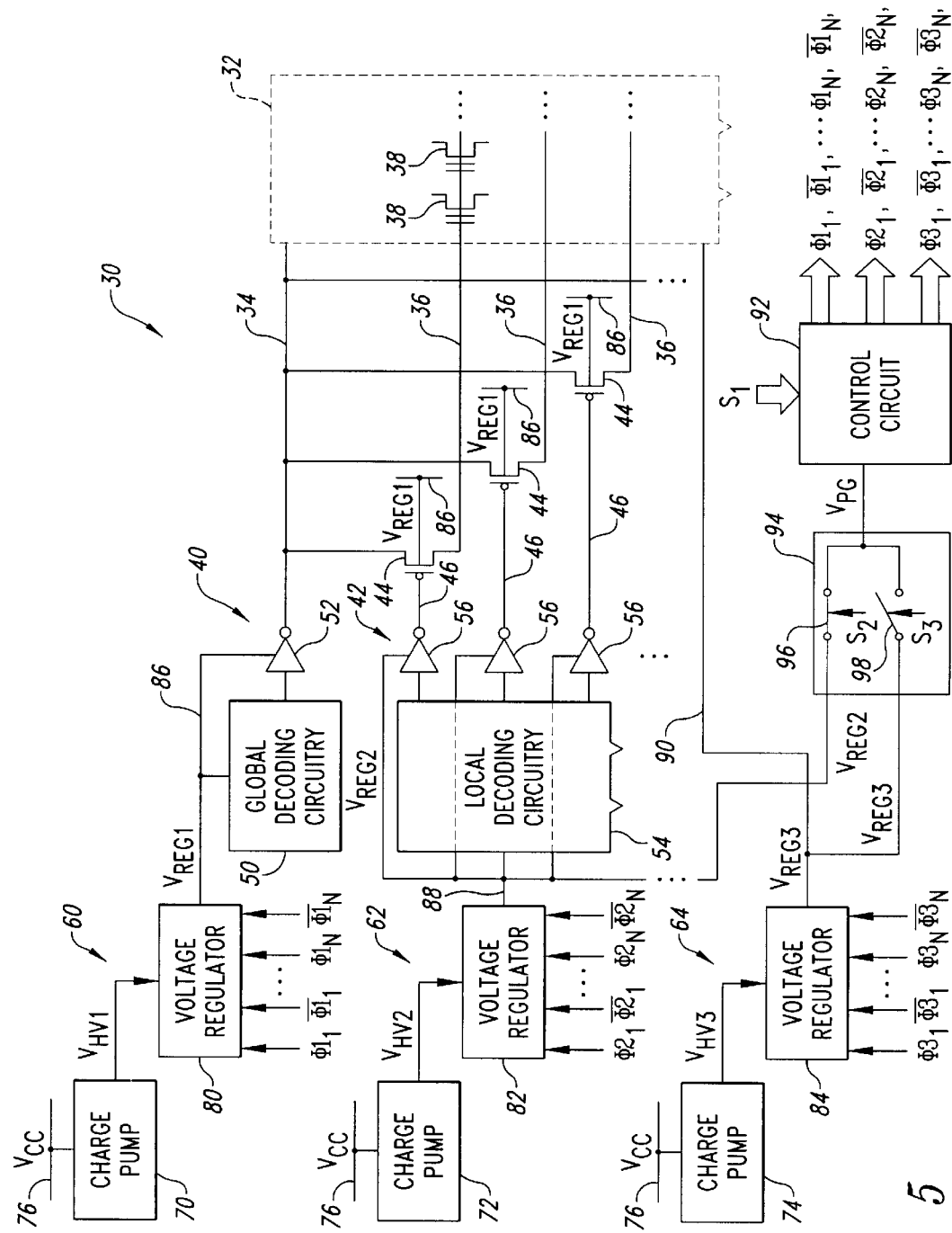
FIG. 5 shows the architecture of a nonvolatile memory with hierarchical row decoding, comprising a switching circuit according to the present invention and used in combination with the control circuit of FIG. 4.

FIG. 5 shows the architecture of a nonvolatile memory with hierarchical row decoding. For simplicity of illustration, FIG. 5 shows only one of the global word lines and some of the local word lines associated thereto, and relates exclusively to the generation of the high positive voltages necessary for biasing the word lines during the steps of reading and programming of the memory cells.

In particular, as illustrated in FIG. 5, the nonvolatile memeory designated as a whole by 30, comprises a memory array 32, organized according to global word lines 34 and local word lines 36 and including a plurality of memory cells 38, in particular multilevel memory cells, which are in turn organized in rows and columns, in which the global word lines 34 are addressed by means of a global row decoder 40 and the local word lines 36 are addressed by means of a local row decoder 42.

In particular, associated to each global word line 34 is a plurality of local word lines 36, which are connected to the respective global word line 34 through respective PMOS selection transistors 44, each of which has a source terminal connected to the global word line 34, a drain terminal connected to the local word line 36, and a gate terminal connected to the local row decoder 42 through a respective control line 46 distinct from the control lines 46 to which the other PMOS transistors 44 are connected and on which it receives a corresponding control signal.

In detail, the global row decoder 40 comprises a global decoding circuitry 50 designed to identify the global word line 34 to be addressed and a plurality of global driving output stages 52, one for each global word line 34 (only one of said stages 52 being shown in FIG. 5), arranged between the global decoding circuitry 50 aid the global word lines 34 and designed to bias the global word lines 34 at the voltages that are each time necessary.

Likewise, the local row decoder 42 comprises a local decoding circuitry 54 designed to identify the local word line 36 to be addressed and a plurality of local driving output stages 56, one for each local word line 36, arranged between the local decoding circuitry 54 and respective control lines 46 connected to the gate terminals of the PMOS transistors 44 and designed to control turning-on and turning-off of the PMOS transistors 44 to enable or disable transfer of the voltage present on the global word line 34 to the local word lines 36.

Addressing of the global word lines 34 can be alternatively performed by means of a single global row decoder 40 or by a number of global row decoders 40 distinct from one another; likewise, addressing of the local word lines 36 can be alternatively performed by means of a single local row decoder 42 or by a number of local row decoders 42 distinct from one another.

The nonvolatile memory 30 further comprises a first supply stage 60 for supplying the global row decoder 40, a second supply stage 62 for supplying the local row decoder 42, and a third supply stage 64 for biasing the drain terminals of the memory cells in the programming step, and their source terminals (and possibly their triple-well terminals) in the erasing step.

In particular, the supply stages 60, 62, 64 have a circuit structure altogether identical to that of the supply stage 1; i.e., each of them comprises a voltage-boosting circuit 70, 72, 74 having an input connected to a supply line 76 set at the supply voltage $V_{CC}$ supplied from outside to the nonvolatile memory 30, and an output supplying a boosted voltage $V_{HV1}$, $V_{HV2}$, $V_{HV3}$ having an amplitude greater than the supply voltage $V_{CC}$ (for example, 10 V). Each of them further comprises a voltage regulator 80, 82, 84 having an input connected to the output of the corresponding voltage-boosting circuit 70, 72, 74 and an output connected to a supply line 86, 88, 90, on which it supplies a regulated voltage $V_{REG1}$, $V_{REG2}$, $V_{REG3}$.

Connected to the supply line 86 are the global decoding circuitry 50, the global driving output stages 52 and all the bulk terminals of the PMOS transistors 44, in such a way as to be biased at the highest voltage in order to prevent both direct temporary biasing of the PN junctions ("latch-up"

phenomenon) and the so-called "body effect". The local decoding circuitry 54 and the local driving output stages 56 are instead connected to the supply line 88.

The voltage regulators 80, 82, 84 have a circuit structure altogether identical to that of the voltage regulator 3, and consequently the said structure will not be described in detail again. Each one of the voltage regulators 80, 82, 84 receives at input a respective set of control signals for its own pass-gate CMOS switches. In particular (FIG. 5), the control signals supplied to the first voltage regulator 80 are designated by $\phi 1_1, \overline{\phi} 1_1, \ldots, \phi 1^N, \overline{\phi} 1^N$, the control signals supplied to the second voltage regulator 82 are designated by $\phi 2_1, \overline{\phi} 2_N, \ldots, \phi 2^N, \overline{\phi} 2^N$, and the control signals supplied to the third voltage regulator 84 are designated by $\phi 3_1, \overline{\phi} 3_1, \ldots, \phi 3_N, \overline{\phi} 3_n$.

The control signals $\phi 1_1, \overline{\phi} 1_1, \ldots, \phi 1^N, \overline{\phi} 1_N, \phi 2_1, \overline{\phi} 2_1, \ldots, \phi 2_N, \overline{\phi} 2_N$ e $\phi 3_1, \overline{\phi} 3_1, \ldots, \phi 3_N, \overline{\phi} 3_N$ respectively supplied to the voltage regulators 80, 82, 84 are generated by a control circuit 92 similar to the control circuit 22 and having a supply input receiving a supply voltage $V_{PG}$, a signal input receiving control signals SI generated by an appropriate control circuit (not shown), and a plurality of pairs of outputs, one for each pass-gate CMOS switch of the voltage regulators 80, 82, 84, supplying the aforementioned control signals.

The table below shows an example of the regulated voltages $V_{REG1}, V_{REG2}, V_{REG3}$ respectively generated by the three voltage generators 80, 82, 84 in the various steps of operation of the nonvolatile memory 32, to which a supply voltage $V_{CC}$ of 3 V is supplied.

|  | READING | PROGRAMMING | ERASURE |
| --- | --- | --- | --- |
| $V_{REG1}$ | 6 V | 1.5–9 V; 300 mV step | 1.5 V |
| $V_{REG2}$ | 6.5 V | 6.5 V if $V_{REG1}$ < 6 V<br>9 V if $V_{REG1}$ > 6 V | 1.5 V |
| $V_{REG3}$ | $V_{CC}$ | 4.2 v | 3.6–9 V; 300 mV step |

From an analysis of the above table it may be noted how, during the reading step, the regulated voltage $V_{REG2}$ is kept fixed at a value slightly higher than that of the regulated voltage $V_{REG1}$, whereas, during the programming step the regulated voltage $V_{REG2}$ can assume only two values that are in any case higher than that of the regulated voltage $V_{REG1}$.

During the erasure step, instead, the regulated voltage $V_{REG3}$ varies with steps of 300 mV, and its initial value is at least equal to the maximum supply voltage admissible for the memory (3.6 V), and hence guarantees an adequate minimum potential.

If then it is desired to supply the control circuit 90 with a regulated voltage generated by a voltage regulator, in the light of what emerges from the analysis of the foregoing table it is therefore evident that the voltage regulator 82, i.e., the one that supplies at output the regulated voltage $V_{REG2}$ for biasing the local row decoder 42, would be the most indicated during the reading and programming steps, whilst the voltage regulator 40, i.e., the one that supplies at output the regulated voltage $V_{REG3}$ for biasing the drain and source terminals of the memory cells 38, would be the most suitable in the erasure step.

Therefore, the supply voltage $V_{PG}$ of the control circuit 92 is selected between the regulated voltages $V_{REG2}$ and $V_{REG3}$ by means of a switching circuit 94 formed by a first switch 96 and a second switch 98, which are obtained, for example, by means of MOS transistors that are controlled in phase opposition via a first control signal S2 and a second control signal S3 generated by a signal-generator circuit (not shown), and have first terminals connected to the supply lines 88, 90 (which in turn are respectively connected to the output of the voltage regulator 82 and the output of the voltage regulator 84), and second terminals connected together and to the supply input of the control circuit 92 to supply, to the latter, the supply voltage $V_{PG}$.

In particular, the control signals S2 and S3 determine, according to the operating step of the nonvolatile memory 30 (reading, programming, erasure), by which, between the voltage regulator 82 and the voltage regulator 84, the control circuit 92 is supplied, i.e., according to which, between the regulated voltages $V_{REG2}$ and $V_{REG3}$, the control signals of the switches of the voltage regulators 80, 82, 84 are generated.

In detail, the control signals S2 and S3 bring about closing of the switch 96 and opening of the switch 98 during the steps of reading and programming of the memory cells 38, consequently bringing about supply of the control circuit 92 with the regulated voltage $V_{REG2}$, and opening of the switch 96 and closing of the switch 98 during the step of erasure of the memory cells 38, consequently causing supply of the control circuit 92 with the regulated voltage $V_{REG3}$.

In order to not introduce undesired perturbation in the regulated voltages $V_{REG1}, V_{REG2}, V_{REG3}$, generated by the voltage regulators 80, 82, 84 during switching of the switches 96, 98, the control signals S2 and S3 must be appropriately timed in such a way as not to overlap one another in time. In particular, the switch 96, 98 that is closed must open before its complementary switch is closed, so preventing the outputs of the voltage regulators 80, 82, 84 from being short-circuited, even though only for a short time.

From an examination of the characteristics of the present invention, the advantages that it affords emerge evidently.

First of all, the present invention maintains the advantages of the known voltage regulators both in terms of the conductivity of the pass-gate switches of the resistive divider and in terms of noise rejection.

Furthermore, choosing, by means of a switching circuit, with appropriate timings, which is the voltage regulator that each time guarantees the control circuit 92 the highest supply voltage according to the current operating step of the memory makes it possible to achieve the maximum conductivity of those switches of the voltage regulators 80, 82, 84 that must at that moment produce a short circuit of the corresponding resistors.

Finally, it is clear that modifications and variations may be made to the invention described and illustrated herein, without thereby departing from the sphere of protection of the said invention, as defined by the attached claims.

For example, the control signals supplied to the voltage regulators 80, 82, 84 could be generated, instead of by a single control circuit 92, by three distinct control circuits, one for each voltage regulator 80, 82, 84, each control circuit having a supply input connected to the output of the switching circuit 94 and a plurality of pairs of outputs on which the control signals supplied to the respective voltage regulator 80, 82, 84 are present.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A nonvolatile memory, comprising:

a memory array organized according to global word lines and local word lines and having a plurality of memory cells;

global row decoding means;

local row decoding means;

first supply means for supplying said global row decoding means;

second supply means for supplying said local row decoding means;

third supply means for biasing terminals of said memory cells;

each of said first, second and third supply means having a plurality of electronic components connected in series, and a plurality of first controlled switching means, each of which is connected in parallel to a respective one of said electronic components;

control means being provided for controlling opening and closing of each of said first controlled switching means; and supply switching means for selectively connecting a supply input of said control means to an output of said second supply means and to an output of said third supply means according to an operating step of the nonvolatile memory.

2. The nonvolatile memory according to claim 1, wherein said supply switching means connect said supply input of said control means to said output of said second supply means during steps of reading and programming of said memory cells, and to said output of said third supply means during a step of erasure of said memory cells.

3. The nonvolatile memory according to claim 1, wherein said supply switching means comprise second controlled switching means arranged between said supply input of said control means and said output of said second supply means, and third controlled switching means arranged between said supply input of said control means and said output of said third supply means.

4. The nonvolatile memory according to claim 3, wherein said second and third controlled switching means receive, on respective control inputs, respective control signals not overlapping one another in time.

5. The nonvolatile memory according to claim 1, wherein said first controlled switching means comprise pass-gate CMOS switches.

6. The nonvolatile memory according to claim 1, wherein said electronic components comprise respective resistors.

7. The nonvolatile memory according to claim 1, wherein each of said first, second and third supply means comprises voltage-boosting means and voltage-regulating means cascade-connected; said voltage-regulating means comprising feedback amplifying means provided with a feedback network comprising said electronic components and said first controlled switching means.

8. The nonvolatile memory according to claim 7, wherein said supply switching means selectively connect said supply input of said control means to an output of the voltage-regulating means of said second supply means and to an output of the voltage-regulating means of said third supply means.

9. A method comprising:

providing regulated voltage to a nonvolatile memory array using first, second and third voltage regulators, wherein the first voltage regulator supplies a first regulated voltage to global decoding circuitry in the memory via a first supply line, the second voltage regulator supplies a second regulated voltage to local decoding circuitry in the memory via a second supply line, and the third voltage regulator supplies a third regulated voltage via a third supply line, for biasing memory cells of the memory during programming and erasing of the cells;

selecting levels of the regulated voltages supplied by the first, second and third voltage regulators using a control circuit that generates first, second and third control signals to the first, second and third voltage regulators, respectively; and supplying, as a voltage supply to the control circuit, whichever of the first, second or third regulated voltages is greatest, during any particular phase of operation of the memory.

10. The method of claim 9, wherein the first, second and third voltage regulators each comprise a voltage boosting circuit and a voltage regulating circuit.

11. The method of claim 9, wherein each of the first, second and third control signals comprises a plurality of control signals.

12. The method of claim 9, wherein the supplying step comprises switching a connection of an input terminal of the control circuit from one of the second or third supply lines to a different one of the second or third supply lines.

13. The method of claim 12, wherein the switching step is carried out by a switching circuit having first and second input terminals connected to the second and third supply lines, respectively, and a single output terminal connected to the input terminal of the control circuit, and wherein the switching circuit connects the supply line having the highest voltage level to the input terminal of the control circuit.

14. The method of claim 13, wherein the switching step comprises inserting a time delay between opening a connection between one input terminal of the switching circuit and the output terminal, and closing a connection between another input terminal of the switching circuit and the output terminal.

15. The method of claim 12, wherein the input terminal of the control circuit is connected to the output of the second supply line during reading and programming of the memory, and to the output of the third supply line during erasing of the memory.

16. A nonvolatile memory, comprising:

a memory array having a plurality of memory cells organized into rows and columns;

a row decoder structured to access an addressed one of the rows;

a first voltage regulator having a supply output coupled to the row decoder;

a second voltage regulator having a supply output coupled to terminals of the memory cells;

a regulator controller coupled to the first and second voltage regulators and structured to control voltages that are provided by the first and second voltage regulators to the row decoder and memory cells, respectively; and a switch unit coupled between a supply input of the regulator controller and the first and second regulators, the switch unit being structured to selectively connect the supply input of the regulator controller to the supply output of the first voltage regulator and to the supply output of the second voltage regulator.

17. The nonvolatile memory of claim 16, wherein the switch unit connects the supply input of the regulator controller to the supply output of the first voltage regulator during steps of reading and programming of the plurality of memory cells, and connects the supply input of the regulator controller to the supply output of the second voltage regulator during steps of erasure of the plurality of memory cells.

18. The nonvolatile memory of claim 16, wherein the first voltage regulator comprises a global row decoder regulator and a local row decoder regulator.

19. The nonvolatile memory of claim 16, wherein the switch unit comprises first and second input terminals connected to the supply outputs of the first and second voltage regulators, respectively, and an output terminal connected to the supply input of the regulator controller.

20. The nonvolatile memory of claim 19, wherein the switch unit comprises a delay circuit configured to insert a time delay between opening a connection between one input terminal of the switch unit and the output terminal, and closing a connection between the other input terminal of the switch circuit and the output terminal.

* * * * *